(12) United States Patent
van Schravendijk et al.

(10) Patent No.: US 8,242,028 B1
(45) Date of Patent: Aug. 14, 2012

(54) UV TREATMENT OF ETCH STOP AND HARD MASK FILMS FOR SELECTIVITY AND HERMETICITY ENHANCEMENT

(75) Inventors: Bart van Schravendijk, Sunnyvale, CA (US); Christian Denisse, Lepelstraat (NL)

(73) Assignee: Novellus Systems, Inc., San Jose, CA (US)

( * ) Notice: Subject to any disclaimer, the term of this patent is extended or adjusted under 35 U.S.C. 154(b) by 499 days.

(21) Appl. No.: 11/696,102

(22) Filed: Apr. 3, 2007

(51) Int. Cl.
*H01L 21/31* (2006.01)
*H01L 21/469* (2006.01)
*H01L 21/00* (2006.01)

(52) U.S. Cl. . 438/763; 438/795; 438/970; 257/E31.054; 257/E31.093

(58) Field of Classification Search .................. 438/763, 438/795–799; 257/749, E31.054, E31.093
See application file for complete search history.

(56) References Cited

U.S. PATENT DOCUMENTS

| | | | |
|---|---|---|---|
| 3,983,385 A | 9/1976 | Troue |
| 4,357,451 A | 11/1982 | McDaniel |
| 4,391,663 A | 7/1983 | Hutter, III |
| 4,563,589 A | 1/1986 | Scheffer |
| 4,885,262 A | 12/1989 | Ting et al. |
| 5,178,682 A | 1/1993 | Tsukamoto et al. |
| 5,268,320 A | 12/1993 | Holler et al. |
| 5,282,121 A | 1/1994 | Bornhorst et al. |
| 5,504,042 A | 4/1996 | Cho et al. |
| 5,582,880 A | 12/1996 | Mochizuki et al. |
| 5,686,054 A | 11/1997 | Barthel et al. |
| 5,700,844 A | 12/1997 | Hedrick et al. |
| 5,789,027 A | 8/1998 | Watkins et al. |
| 5,840,600 A | 11/1998 | Yamazaki et al. |
| 5,851,715 A | 12/1998 | Barthel et al. |
| 5,858,457 A | 1/1999 | Brinker et al. |
| 5,876,798 A | 3/1999 | Vassiliev |
| 5,877,095 A | 3/1999 | Tamura et al. |
| 6,015,503 A | 1/2000 | Butterbaugh et al. |
| 6,098,637 A | 8/2000 | Parke |
| 6,132,814 A | 10/2000 | Livesay et al. |
| 6,136,680 A | 10/2000 | Lai et al. |
| 6,140,252 A | 10/2000 | Cho et al. |
| 6,150,272 A | 11/2000 | Liu et al. |

(Continued)

FOREIGN PATENT DOCUMENTS

JP 01-107519 4/1989

(Continued)

OTHER PUBLICATIONS

Schravendijk, et al., "UV Treatment of STI Films for Stress," Novellus Systems, Inc., U.S. Appl. No. 11/811,048, filed Jun. 7, 2007.

(Continued)

*Primary Examiner* — Leonard Chang
(74) *Attorney, Agent, or Firm* — Weaver Austin Villeneuve & Sampson LLP

(57) ABSTRACT

A method for the ultraviolet (UV) treatment of etch stop and hard mask film increases etch selectivity and hermeticity by removing hydrogen, cross-linking, and increasing density. The method is particularly applicable in the context of damascene processing. A method provides for forming a semiconductor device by depositing an etch stop film or a hard mask film on a substrate and exposing the film to UV radiation and optionally thermal energy. The UV exposure may be direct or through another dielectric layer.

20 Claims, 4 Drawing Sheets

U.S. PATENT DOCUMENTS

| | | |
|---|---|---|
| 6,228,563 B1 | 5/2001 | Starov et al. |
| 6,232,248 B1 | 5/2001 | Shinriki et al. |
| 6,254,689 B1 | 7/2001 | Meder |
| 6,268,288 B1 | 7/2001 | Hautala et al. |
| 6,270,846 B1 | 8/2001 | Brinker et al. |
| 6,271,273 B1 | 8/2001 | You et al. |
| 6,284,050 B1 | 9/2001 | Shi et al. |
| 6,290,589 B1 | 9/2001 | Tolles |
| 6,291,334 B1 | 9/2001 | Somekh |
| 6,329,017 B1 | 12/2001 | Liu et al. |
| 6,329,062 B1 | 12/2001 | Gaynor |
| 6,340,628 B1 | 1/2002 | Van Cleemput et al. |
| 6,365,266 B1 | 4/2002 | MacDougall et al. |
| 6,383,466 B1 | 5/2002 | Domansky et al. |
| 6,383,955 B1 | 5/2002 | Matsuki et al. |
| 6,386,466 B1 | 5/2002 | Ozawa et al. |
| 6,387,453 B1 | 5/2002 | Brinker et al. |
| 6,391,932 B1 | 5/2002 | Gore et al. |
| 6,392,017 B1 | 5/2002 | Chandrashekar |
| 6,394,797 B1 | 5/2002 | Sugaya et al. |
| 6,399,212 B1 | 6/2002 | Sakai et al. |
| 6,417,092 B1 | 7/2002 | Jain et al. |
| 6,420,441 B1 | 7/2002 | Allen et al. |
| 6,444,715 B1 | 9/2002 | Mukherjee et al. |
| 6,467,491 B1 | 10/2002 | Sugiura et al. |
| 6,479,374 B1 | 11/2002 | Ioka et al. |
| 6,479,409 B2 | 11/2002 | Shioya et al. |
| 6,485,599 B1 | 11/2002 | Glownia et al. |
| 6,518,130 B1 | 2/2003 | Ohno |
| 6,531,193 B2 | 3/2003 | Fonash et al. |
| 6,534,395 B2 | 3/2003 | Werkhoven et al. |
| 6,548,113 B1 | 4/2003 | Birnbaum et al. |
| 6,558,755 B2 | 5/2003 | Berry et al. |
| 6,563,092 B1 | 5/2003 | Shrinivasan et al. |
| 6,576,300 B1 | 6/2003 | Berry et al. |
| 6,593,653 B2 | 7/2003 | Sundararajan et al. |
| 6,596,654 B1 | 7/2003 | Bayman et al. |
| 6,635,575 B1 | 10/2003 | Xia et al. |
| 6,644,786 B1 | 11/2003 | Leben |
| 6,677,251 B1 | 1/2004 | Lu et al. |
| 6,740,602 B1 | 5/2004 | Hendriks et al. |
| 6,740,605 B1 | 5/2004 | Shiraiwa et al. |
| 6,756,085 B2 | 6/2004 | Waldfried et al. |
| 6,759,098 B2 | 7/2004 | Han et al. |
| 6,764,952 B1 | 7/2004 | Yu et al. |
| 6,770,866 B2 | 8/2004 | Retschke et al. |
| 6,777,349 B2 | 8/2004 | Fu et al. |
| 6,797,643 B2 | 9/2004 | Rocha-Alvarez et al. |
| 6,805,801 B1 | 10/2004 | Humayun et al. |
| 6,812,043 B2 | 11/2004 | Bao et al. |
| 6,831,284 B2 | 12/2004 | Demos et al. |
| 6,835,417 B2 | 12/2004 | Saenger et al. |
| 6,848,458 B1 | 2/2005 | Shrinivasan et al. |
| 6,856,712 B2 | 2/2005 | Fauver et al. |
| 6,884,738 B2 | 4/2005 | Asai et al. |
| 6,921,727 B2 | 7/2005 | Chiang et al. |
| 6,958,301 B2 | 10/2005 | Kim et al. |
| 7,005,390 B2 | 2/2006 | Ramachandrarao et al. |
| 7,018,918 B2 | 3/2006 | Kloster et al. |
| 7,030,041 B2 | 4/2006 | Li et al. |
| 7,094,713 B1 | 8/2006 | Niu et al. |
| 7,132,334 B2 | 11/2006 | Lin |
| 7,148,155 B1 | 12/2006 | Tarafdar et al. |
| 7,166,531 B1 | 1/2007 | van den Hoek et al. |
| 7,176,144 B1 | 2/2007 | Wang et al. |
| 7,208,389 B1 | 4/2007 | Tipton et al. |
| 7,235,459 B2 | 6/2007 | Sandhu |
| 7,241,704 B1 | 7/2007 | Wu et al. |
| 7,244,672 B2 | 7/2007 | Nguyen et al. |
| 7,247,582 B2 | 7/2007 | Stern et al. |
| 7,253,125 B1 | 8/2007 | Bandyopadhyay et al. |
| 7,256,111 B2 | 8/2007 | Lopatin et al. |
| 7,265,061 B1 | 9/2007 | Cho et al. |
| 7,304,302 B1 | 12/2007 | Nunan et al. |
| 7,332,445 B2 | 2/2008 | Lukas et al. |
| 7,381,659 B2 | 6/2008 | Nguyen et al. |
| 7,390,537 B1 | 6/2008 | Wu et al. |
| 7,394,067 B1 | 7/2008 | Soltz et al. |
| 7,481,882 B2 | 1/2009 | Won et al. |
| 7,504,663 B2 | 3/2009 | Yamazaki et al. |
| 7,510,982 B1 | 3/2009 | Draeger et al. |
| 7,611,757 B1 | 11/2009 | Bandyopadhyay et al. |
| 7,622,162 B1 | 11/2009 | Schravendijk et al. |
| 7,790,633 B1 | 9/2010 | Tarafdar et al. |
| 7,851,232 B2 | 12/2010 | van Schravendijk et al. |
| 7,906,174 B1 | 3/2011 | Wu et al. |
| 2001/0001501 A1 | 5/2001 | Lee et al. |
| 2001/0014512 A1 | 8/2001 | Lyons et al. |
| 2002/0001973 A1 | 1/2002 | Wu et al. |
| 2002/0016085 A1 | 2/2002 | Huang et al. |
| 2002/0034626 A1 | 3/2002 | Liu et al. |
| 2002/0064341 A1 | 5/2002 | Fauver et al. |
| 2002/0106500 A1 | 8/2002 | Albano et al. |
| 2002/0117109 A1 | 8/2002 | Hazelton et al. |
| 2002/0123218 A1* | 9/2002 | Shioya et al. ............... 438/635 |
| 2002/0123240 A1 | 9/2002 | Gallagher et al. |
| 2002/0172766 A1 | 11/2002 | Laxman et al. |
| 2002/0195683 A1 | 12/2002 | Kim et al. |
| 2003/0013280 A1 | 1/2003 | Yamanaka |
| 2003/0015764 A1 | 1/2003 | Raaijmakers et al. |
| 2003/0064604 A1 | 4/2003 | Umeda |
| 2003/0064607 A1 | 4/2003 | Leu et al. |
| 2003/0068881 A1 | 4/2003 | Xia et al. |
| 2003/0134038 A1 | 7/2003 | Paranjpe |
| 2003/0157248 A1 | 8/2003 | Watkins et al. |
| 2003/0157267 A1 | 8/2003 | Waldfried et al. |
| 2003/0199603 A1 | 10/2003 | Walker et al. |
| 2003/0228770 A1 | 12/2003 | Lee et al. |
| 2004/0004247 A1 | 1/2004 | Forbes et al. |
| 2004/0018319 A1 | 1/2004 | Waldfried et al. |
| 2004/0022960 A1 | 2/2004 | Rhee et al. |
| 2004/0023513 A1 | 2/2004 | Aoyama et al. |
| 2004/0029391 A1 | 2/2004 | Kirkpatrick et al. |
| 2004/0033662 A1 | 2/2004 | Lee et al. |
| 2004/0058090 A1 | 3/2004 | Waldfried et al. |
| 2004/0069410 A1 | 4/2004 | Moghadam et al. |
| 2004/0082163 A1 | 4/2004 | Mori et al. |
| 2004/0096593 A1 | 5/2004 | Lukas et al. |
| 2004/0096672 A1 | 5/2004 | Lukas et al. |
| 2004/0099952 A1 | 5/2004 | Goodner et al. |
| 2004/0101633 A1 | 5/2004 | Zheng et al. |
| 2004/0102031 A1 | 5/2004 | Kloster et al. |
| 2004/0166240 A1 | 8/2004 | Rhee et al. |
| 2004/0175501 A1* | 9/2004 | Lukas et al. ............ 427/255.28 |
| 2004/0185679 A1 | 9/2004 | Ott et al. |
| 2004/0221871 A1 | 11/2004 | Fletcher et al. |
| 2004/0224496 A1 | 11/2004 | Cui et al. |
| 2005/0025892 A1 | 2/2005 | Satoh et al. |
| 2005/0064726 A1 | 3/2005 | Reid et al. |
| 2005/0079717 A1* | 4/2005 | Savas et al. ................. 438/689 |
| 2005/0112282 A1 | 5/2005 | Gordon et al. |
| 2005/0156285 A1* | 7/2005 | Gates et al. ................. 257/632 |
| 2005/0161821 A1 | 7/2005 | Lee et al. |
| 2005/0164497 A1 | 7/2005 | Lopatin et al. |
| 2005/0170104 A1 | 8/2005 | Jung et al. |
| 2005/0191803 A1 | 9/2005 | Matsuse et al. |
| 2005/0194619 A1 | 9/2005 | Edelstein et al. |
| 2005/0208758 A1 | 9/2005 | Lu et al. |
| 2005/0260357 A1 | 11/2005 | Olsen et al. |
| 2005/0260420 A1 | 11/2005 | Collins et al. |
| 2005/0272220 A1 | 12/2005 | Waldfried et al. |
| 2006/0024976 A1 | 2/2006 | Waldfried et al. |
| 2006/0027929 A1 | 2/2006 | Cooney et al. |
| 2006/0063662 A1 | 3/2006 | Hata et al. |
| 2006/0105106 A1 | 5/2006 | Balseanu et al. |
| 2006/0118817 A1 | 6/2006 | Haisma |
| 2006/0121208 A1 | 6/2006 | Siegel |
| 2006/0142143 A1 | 6/2006 | Abrevaya et al. |
| 2006/0145304 A1 | 7/2006 | Boyanov et al. |
| 2006/0216839 A1 | 9/2006 | Shenesh et al. |
| 2006/0220251 A1 | 10/2006 | Kloster |
| 2006/0246672 A1 | 11/2006 | Chen et al. |
| 2006/0260538 A1 | 11/2006 | Ye et al. |
| 2007/0015355 A1* | 1/2007 | Lin et al. .................... 438/624 |
| 2007/0032024 A1 | 2/2007 | Peidous et al. |
| 2007/0042581 A1 | 2/2007 | Sano et al. |
| 2007/0054504 A1 | 3/2007 | Chen et al. |

| | | | |
|---|---|---|---|
| 2007/0105292 A1 | 5/2007 | Chen et al. | |
| 2007/0132054 A1 | 6/2007 | Arghavani et al. | |
| 2007/0134821 A1 | 6/2007 | Thakur et al. | |
| 2007/0134907 A1 | 6/2007 | Ikeda et al. | |
| 2007/0189961 A1 | 8/2007 | Iacopi et al. | |
| 2007/0196011 A1 | 8/2007 | Cox et al. | |
| 2007/0222081 A1 | 9/2007 | Chen et al. | |
| 2007/0224824 A1 | 9/2007 | Chen et al. | |
| 2007/0275569 A1 | 11/2007 | Moghadam et al. | |
| 2007/0281497 A1 | 12/2007 | Liu et al. | |
| 2007/0287240 A1 | 12/2007 | Chen et al. | |
| 2008/0009141 A1 | 1/2008 | Dubois et al. | |
| 2008/0020591 A1 | 1/2008 | Balseanu et al. | |
| 2008/0132055 A1 | 6/2008 | Nguyen et al. | |
| 2008/0199977 A1 | 8/2008 | Weigel et al. | |
| 2008/0286697 A1 | 11/2008 | Verhaverbeke et al. | |
| 2008/0305600 A1 | 12/2008 | Liao et al. | |
| 2009/0017640 A1 | 1/2009 | Huh et al. | |
| 2009/0039475 A1 | 2/2009 | Shioya | |
| 2011/0111533 A1 | 5/2011 | Varadarajan et al. | |

FOREIGN PATENT DOCUMENTS

| | | | |
|---|---|---|---|
| JP | 09-306892 | | 11/1997 |
| JP | 2006165573 A | * | 6/2006 |
| JP | 63-307740 | | 12/2008 |
| KR | 2000-0043888 | | 7/2000 |
| WO | 2006/104583 | | 10/2006 |
| WO | 2006/127463 | | 11/2006 |
| WO | 2007/043206 | | 4/2007 |

OTHER PUBLICATIONS

Notice of Allowance and Fee Due mailed May 22, 2006, from U.S Appl. No. 10/672,311.
Allowed Claims from U.S. Appl. No. 10/672,311.
Notice of Allowance and Fee Due mailed Apr. 4, 2007, from U.S Appl. No. 10/825,888.
Allowed Claims from U.S. Appl. No. 10/825,888.
Bandyopadhyay et al., "Method to Improve Mechanical Strength of Low-K Dielectric Film Using Modulated UV Exposure," Novellus Systems, Inc., U,S. Appl. No. 11/824,049, filed Jun. 28, 2007.
Notice of Allowance and Fee Due mailed Oct. 10, 2006, from U.S Appl. No. 10/800,377.
Allowed Claims from U.S. Appl. No. 10/800,377.
U.S. Office Action mailed Nov. 28, 2007, from U.S. Appl. No. 10/807,680.
R.J. Lewis, Sr., Hawley's Condensed Chemical Dictionary, 12$^{th}$ Edition, Van Nostrad Reinhold Co., New York, 1993 (no month), excerpts pp. 916-918 & 1123-1124.
Notice of Allowance and Fee Due mailed Dec. 20, 2005, from U.S. Appl. No. 10/860,340.
Allowed Claims from U.S. Appl. No. 10/860,340.
U.S. Office Action mailed Dec. 12, 2007, from U.S. Appl. No. 11/146,456.
U.S. Office Action mailed Oct. 3, 2007, from U.S. Appl. No. 11/115,576.
Shaviv et al., "UV Treatment to Improve Integrity and Performance of Front End Dielectrics," Novellus Systems, Inc., U.S. Appl. No. 11/622,409, filed Jan. 11, 2007.
van Schravendijk et al., "UV Treatment for Carbon-Containing Low-K Dielectric Repair in Semiconductor Processing," Novellus Systems, Inc., U.S. Appl. No. 11/590,661, filed Oct. 30, 2006.
Shrinivassan et al., "Multi-Station Sequential Curing of Dielectric Films," Novellus Systems, Inc., U.S. Appl. No. 11/688,695, filed Mar. 20, 2007.
Varadarajan et al., "A Cascaded Cure Approach to Fabricate Highly Tensile Silicon Nitride Films," Novellus Systems, Inc., U.S. Appl. No. 11/897,838, filed Aug. 31, 2007.
Van den Hoek, et al., "VLSI Fabrication Processes for Introducing Pores Into Dielectric Materials," Novellus Systems, Inc., U.S. Appl. No. 11/606,340, filed Nov. 28, 2006.
U.S. Office Action mailed Jan. 10, 2008, from U.S. Appl. No. 11/622,423.
Bhadri Varadarajan et al., "Development of High Stress SiN Films for Use with Strained Silicon Technologies"; Proc. 68$^{th}$ Symp. On Semiconductors and IC Tech.; Kyoto 2005.

Shrinivasan et al., U.S. Appl. No. 11/115,576, "Single-chamber sequential curing of semiconductor wafers", filed Apr. 26, 2005.
Seon-Mee Cho et al., U.S. Appl. No. 10/800,377, "Method and apparatus for UV exposure of low dielectric constant materials for porogen removal and improved mechanical properties", filed Mar. 11, 2004.
Varadarajan et al., U.S. Appl. No. 10/972,084, "Tensile dielectric films using UV curing", filed Oct. 22, 2004.
Cho et al., "Plasma Treatments of Molecularly Templated Nanoporous Silica Films," Electrochemical and Solid-State Letters, 4 (4) G35-G38 (2001).
Yung et al., "Spin-on Mesoporous Silica Films with Ultralow Dielectric Constants, Ordered Pore Structures, and Hydrophobic Surfaces," Adv. Mater. 2001, 13, No. 14, 1099-1102.
Schulberg et al., "System for Deposition of Mesoporous Materials," U.S. Appl. No. 10/295,965, filed Nov. 15, 2002, 64 Pages.
Watkins et al., "Mesoporous Materials and Methods," U.S. Appl. No. 10/301,013, filed Nov. 21, 2002, 34 Pages.
Justin F. Gaynor, "In-Situ Treatment of Low-K Films With a Silylating Agent After Exposure to Oxidizing Environments," U.S. Appl. No. 10/056,926, filed Jan. 24, 2002, 34 Pages.
Tipton et al., "Method of Porogen Removal From Porous Low-K Films Using UV Radiation", Novellus Systems, Inc., U.S. Appl. No. 10/672,311, filed Sep. 26, 2003, pp. 1-27.
Jan, C.H., et al, *90NM Generation, 300mm Wafer Low k ILD/Cu Interconnect Technology*, 2003 IEEE Interconnect Technology Conference.
Gangpadhyay et al., "The First International Surface Cleaning Workshop," Northeastern University, Nov. 11-14, 2002.
Cho et al., "Method and Apparatus for UV Exposure of Low Dielectric Constant Materials for Porogen Removal and Improved Mechanical Properties", Novellus Systems, Inc., U.S. Appl. No. 10/800,377, filed Mar. 11, 2004, pp. 1-31.
Wu et al., "Method and Apparatus of UV Exposure of Low Dielectric Constant Materials for Porogen Removal and Improved Mechanical Properties", Novellus Systems, Inc., U.S. Appl. No. 10/807,680, filed Mar. 23, 2004, pp. 1-34.
Tipton et al., "Method of Porogen Removal From Porous Low-K Films Using UV Radiation", U.S. Appl. No. 10/672,311, filed Sep. 26, 2003, Office Action dated Sep. 7, 2004.
Tipton et al., "Method of Porogen Removal From Porous Low-K Films Using UV Radiation", U.S. Appl. No. 10/672,311, filed Sep. 26, 2003, Office Action dated Dec. 28, 2004.
Bandyopadhyay et al., "Method to Improve Mechanical Strength of Low-K Dielectric Film Using Modulated UV Exposure", U.S. Appl. No. 10/825,888, filed Apr. 16, 2004.
Peter Singer, "New Materials and Designs to Improve Transistor Performance", Apr. 1, 2004, Semiconductor International.
Ghani et al, "A 90nm High Volume Manufacturing Logic Technology Featuring Novel 45nm Gate Length Strained Silicon CMOS Transistors", IEEE, © 2003.
Bhadri N. Varadarajan, "Tensile Silicon Nitride—P1264 NESL", C & F Study, Aug. 21, 2003.
Niu et al., "Methods for Improving the Cracking Resistance of Low-K Dielectric Materials", U.S. Appl. No. 10/860,340, Office Action dated Mar. 2, 2005.
Niu et al., "Methods for Improving the Cracking Resistance of Low-K Dielectric Materials", U.S. Appl. No. 10/860,340, Final Office Action dated Jun. 13, 2005.
Draeger et al., "Creation of Porosity in Low-K Films by Photo-Disassociation of Imbedded Nanoparticles," U.S. Appl. No. 11/146,456, filed Jun. 6, 2005.
Cho et al., "Methods of Improving Porogen Removal and Film Mechanical Strength in Producing Ultra Low-K Carbon Doped Oxide Films Using Radical Photopolymerization", U.S. Appl. No. 10/982,654, filed Nov. 5, 2004.
U.S. Office Action mailed Jul. 13, 2005, from U.S. Appl. No. 10/672,311.
U.S. Office Action mailed Dec. 20, 2005, from U.S. Appl. No. 10/672,311.
U.S. Office Action mailed Mar. 29, 2006, from U.S. Appl. No. 10/800,377.

Kelman et al., "Method for Reducing Stress in Porous Dielectric Films", U.S. Appl. No. 11/369,311, filed Mar. 6, 2006.
U.S. Office Action mailed Jun. 28, 2006, from U.S Application No. 10/825,888.
U.S. Office Action mailed Dec. 27, 2006, from U.S. Appl. No. 10/825,888.
Cho et al., "Method and Apparatus for UV Exposure of Low Dielectric Constant Materials for Porogen Removal and Improved Mechanical Properties", Novellus Systems, Inc., U.S. Appl. No. 11/656,661, filed Jan. 22, 2007, pp. 1-28.
Shrinivasan et al., "Single-Chamber Sequential Curing of Semiconductor Wafers," Novellus Systems, Inc., U.S. Appl. No. 11/115,576, filed Apr. 26, 2005, pp. 1-29.
Kamian et al., "UltraViolet Light Treatment Load Lock for Dielectric Films," Novellus Systems, Inc., U.S. Appl. No. 11/561,834, filed Nov. 20, 2006, pp. 1-25.
Vancouver et al., "PECVD Methods for Producing Ultra Low-K Dielectric Films Using UV Treatment," U.S. Appl. No. 11/608,056, filed Dec. 7, 2006, pp. 1-34.
Tarafdar et al., "Sequential Deposition/Anneal Film Densification Method", Novellus Systems, Inc., filed Sep. 11, 2006, U.S. Appl. No. 11/519,445, pp. 1-37.
Schravendijk, "UV Treatment of FSG Films to Improve Film Stability," Novellus Systems, Inc., U.S. Appl. No. 11/622,423, filed Jan. 11, 2007, pp. 1-31.
Arghavani et al., "Strain Engineering in Non-Volatile Memories," Applied Materials, Semiconductor International, Apr. 1, 2006, pp. 1-6.
U.S. Office Action mailed Apr. 3, 2008, from U.S. Appl. No. 10/982,654.
U.S. Office Action mailed Sep. 19, 2008, from U.S. Appl. No. 11/824,049.
U.S. Final Office Action mailed Jul. 10, 2008, from U.S. Appl. No. 10/807,680.
U.S. Final Office Action mailed Jul. 9, 2008, from U.S. Appl. No. 10/982,654.
U.S. Office Action mailed May 14, 2008, from U.S. Appl. No. 11/519,445.
U.S. Final Office Action mailed May 2, 2008, from U.S. Appl. No. 11/115,576.
U.S. Office Action mailed Oct. 17, 2008, from U.S. Appl. No. 11/115,576.
U.S. Office Action mailed Jul. 23, 2008, from U.S. Appl. No. 11/622,423.
U.S. Appl. No. 11/590,661, Office Action mailed Apr. 6, 2009.
U.S. Appl. No. 11/811,048, Office Action mailed Mar. 19, 2009.
U.S. Appl. No. 11/606,340, Office Action mailed Feb. 5, 2009.
U.S. Appl. No. 11/115,576, Office Action mailed Apr. 22, 2009.
U.S. Appl. No. 11/824,049, Allowed Claims.
U.S. Appl. No. 11/811,048, Notice of Allowance mailed Aug. 17, 2009.
U.S. Appl. No. 11/811,048, Allowed Claims.
Varadarajan et al., "Tensile dielectric films using UV curing", U.S. Appl. No. 10/972,084, filed Oct. 22, 2004.
Haverkamp et al., "Enhancing adhesion of cap layer films", U.S. Appl. No. 11/731,581, filed Mar. 30, 2007.
U.S. Appl. No. 11/115,576, Office Action mailed Oct. 1, 2009.
Haverkamp, et al., "Multi-Station Sequential Curing of Dielectric Films," Novellus Systems, Inc., U.S. Appl. No. 11/977,792, filed Oct. 25, 2007.
U S. Appl. No. 11/688,695, Final Office Action mailed Dec. 31, 2009.
Wu, et al., "Methods for Fabricating Zeolite Nano-Crystal Based Low-K Dielectric Films Containing Si(CxHy)n Groups and Treating Films by Ultra-Violet Thermal Processing," Novellus Systems, Inc., U.S. Appl. No. 12/172,089, filed Jul. 11, 2008.
U.S. Appl. No. 11/811,048, Supplemental Notice of Allowance mailed Oct. 8, 2009.
Rodriquez, J.A. et al., "Evolution of the mechanical stress on PECVD silicon oxide films under thermal processing", Journal of Materials Science Letters 19, 2000, pp. 1399-1401.
U.S. Appl. No. 11/824,049, Office Action mailed Mar. 19, 2009.
U.S. Appl. No. 11/824,049, Notice of Allowance mailed Jun. 22, 2009.

U.S. Appl. No. 10/982,654, Office Action mailed Dec. 4, 2008.
U.S. Appl. No. 11/519,445, Office Action mailed Dec. 10, 2008.
U.S. Appl. No. 10/972,084, Office Action mailed Dec. 30, 2008.
U.S. Appl. No. 11/688,695, Office Action mailed Jun. 11, 2009.
Yu, J.J. et al., "UV Annealing of Ultrathin Tantalum Oxide Films", Applied Surface Science, V 186 (2002), 57-63.
U.S. Appl. No. 11/369,311, Office Action mailed Aug. 20, 2009.
U.S. Appl. No. 11/608,056, Office Action mailed Aug. 20, 2009.
P. Morin et al., "Tensile contact etch stop layer for nMOS performance enhancement: influence of the film morphology", ECS meeting, May 2005.
Takagi et al., "High Rate Deposition of a-Si:H and a-SiN$_x$:H by VHF PECVD", Vacuum, 51, 1998.
Smith, D.L et al., "Mechanism of SiN$_3$-SiH$_4$ Llasma", J. Electrochem. Soc., vol. 137 (2) 1990.
Nagayoshi et al., "Residual Stress of a Si$_{1-x}$N$_x$: H Films Prepared by Afterglow Plasma Chemical Vapor Deposition Technique", Jpn. J. Appl. Phys. vol. 31 (1992) pp. L867-L869 Part 2, No. 7A, Jul. 1, 1992.
Varadarajan et al., "Use of VHF RF plasma to deposit high tensile stress films with improved film properties for use in strained silicon technology", U.S. Appl. No. 11/975,473, filed Oct. 18, 2007.
U.S. Appl. No. 11/975,473, Office Action mailed Oct. 28, 2008.
U.S. Appl. No. 11/975,473, Office Action mailed Mar. 23, 2009.
Jiang et al., "Tensile dielectric films using UV curing", U.S. Appl. No. 11/899,683, filed Sep. 7, 2007.
U.S. Appl. No. 11/899,683, Office Action mailed May 29, 2009.
U.S. Appl. No. 11/519,445, Office Action mailed Aug. 26, 2009.
U.S. Appl. No. 11/622,409, Office Action mailed Jul. 1, 2009.
Haverkamp et al , "Enhancing adhesion of cap layer films", U.S. Appl. No. 11/731,581, filed Mar. 30, 2007.
U.S. Appl. 11/731,581, Office Action mailed Jun. 1, 2009.
U.S. Appl. No. 11/975,473, Office Action mailed Oct. 9, 2009.
Bandyopadhyay et al., "Method to Improve Mechanical Strength of Low-K Dielectric Film Using Modulated UV Exposure," Novellus Systems, Inc., U.S. Appl. No. 12/566,514, filed Sep. 24, 2009.
U.S. Appl. No. 11/622,409, Office Action mailed Nov. 5, 2009.
U.S. Appl. No. 11/519,445, Office Action mailed Nov. 4, 2009.
U.S. Appl. No. 10/972,084, Office Action mailed Nov. 27, 2009.
Haverkamp, et al., "Multi-Station Sequential Curing of Dielectric Films," Novellus Systems, Inc., Appl. No. 11/977,792, filed Oct. 25, 2007.
Haverkamp, et al., "Progressive UV Cure," Novellus Systems, Inc., U.S. Appl. No. 12/210,060, filed Sep. 12, 2008.
U.S. Appl. No. 11/369,311, Office Action mailed Jan. 5, 2010.
U.S. Appl. No. 11/688,695, Final Office Action mailed Dec. 31, 2009.
U.S. Appl. No. 11/590,661, Final Office Action mailed Jan. 25, 2010.
U.S. Appl. No. 11/656,661, Office Action mailed Jan. 22, 2010.
U.S. Appl. No. 11/731,581, Office Action mailed Feb. 4, 2010.
U.S. Appl. No. 11/899,683, Office Action mailed Feb. 8, 2010.
Wu, et al., "Methods for Fabricating Zeolite Nano-Crystal Based Low-K Dielectric Films Containing Si (CxHy)n Groups and Treating Films by Ultra-Violet Thermal Processing," Novellus Systems, Inc., U.S. Appl. No. 12/172,089, filed Jul. 11, 2008.
U.S. Appl. No. 11/977,792, Office Action mailed Mar. 9, 2010.
Chaabouni, H. et al., "Porous SiOCH Ultra Low-K recovery treatments after direct CMP process", Advanced Metallization Conference, Sep. 2008.
Chaabouni, H. et al., "Sidewall restoration of porous ultra low-k dielectrics for sub-45 nm technology nodes", Microelectronic Engineering 84 (2007).
Huang, H. et al., "O2 Plasma Damage and Dielectric Recoveries to Patterned CDO Low-k Dielectrics", Advanced Metallization Conference, Sep. 2008.
U.S. Appl. No. 11/608,056, Office Action mailed Mar. 23, 2010.
U.S. Appl. No. 11/975,473, Office Action mailed Mar. 25, 2010.
Takagi et al., "High Rate Deposition of a-SiN$_x$:H by VHF PECVD", Mat. Res. Soc. Symp. Proc. vol. 467, 1997, Materials Research Society.
U.S. Appl. No. 12/726,263, "Apparatus for UV damage repair of low K films prior to copper barrier deposition", van Schravendijk et al., filed Mar. 17, 2010.

U.S. Appl. No. 11/519,445, Notice of Allowance mailed Apr. 21, 2010.
U.S. Appl. No. 11/561,834, Office Action mailed May 21, 2010.
U.S. Appl. No. 12/840,192, "Sequential deposition / anneal film densification method", Tarafdar et al., filed Jul. 20, 2010.
U.S. Appl. No. 11/688,695, Office Action mailed Jul. 23, 2010.
U.S. Appl. No. 11/590,661, Notice of Allowance mailed Aug. 6, 2010.
U.S. Appl. No. 11/656,661, Final Office Action mailed Aug. 24, 2010.
U.S. Appl. No. 12/172,089, Office Action mailed Sep. 13, 2010.
Li, Shuang et al., "Organic-functionalized pure-silica-zeolite MFI low-k films", Chem. Mater. 2005, 17, Mar. 9, 2005, pp. 1851-1854.
U.S. Appl. No. 11/731,581, Final Office Action mailed Sep. 2, 2010.
U.S. Appl. No. 10/972,084, Office Action mailed Oct. 15, 2010.
U.S. Appl. No. 11/977,792, Office Action mailed Oct. 25, 2010.
U.S. Appl. No. 11/975,473, Office Action mailed Nov. 1, 2010.
U.S. Appl. No. 11/608,056, Notice of Allowance mailed Nov. 2, 2010.
U.S. Appl. No. 12/566,514, Office Action mailed Jan. 11, 2011.
U.S. Appl. No. 11/561,834, Final Office Action mailed Dec. 3, 2010.
U.S. Appl. No. 11/688,695, Office Action mailed Feb. 1, 2011.
U.S. Office Action mailed Dec. 12, 2007, from U.S. No. 11/146,456.
U.S. Final Office Action mailed Jul. 25, 2008, from U.S. Appl. No. 11/146,456.
U.S. Appl. No. 11/146,456, Notice of Allowance mailed Nov. 10, 2008.
U.S. Appl. No. 11/146,456, Supplemental Notice of Allowance mailed Dec. 15, 2008.
Draeger et al., "Creation of Porosity in Low-K Films by Photo-Disassociation of Imbedded Nanoparticles," U.S. Appl. No. 12/369,384, filed Feb. 11, 2009.
U.S. Office Action mailed Feb. 22, 2011, from U.S. Appl. No. 12/369,384.
U.S. Appl. No. 11/369,311, Office Action mailed Apr. 13, 2011.
U.S. Appl. No. 12/172,089, Final Office Action mailed Apr. 14, 2011.
U.S. Appl. No. 10/972,084, Office Action mailed May 2, 2011.
U.S. Appl. No. 11/656,661, Office Action mailed May 19, 2011.

* cited by examiner

UV TREATMENT OF ETCH STOP AND HARD MASK FILMS FOR SELECTIVITY AND HERMETICITY ENHANCEMENT

BACKGROUND OF THE INVENTION

The present invention is related to a method of forming a dielectric of the type used in semiconductor applications, and more particularly to a process for improving selectivity and hermeticity characteristics of etch stop films and hard mask layers using UV treatment.

As integrated circuits (IC) feature sizes shrink, problems of increased resistance and resistance-capacitance (RC) coupling offset any speed advantage derived from the smaller device size, limiting improvement in device performance. Ways to improve device performance and reliability include using highly conductive metals, such as copper, and employing lower dielectric constant (low-k) materials.

Low-k materials are, by definition, those semiconductor-grade insulating materials that have a dielectric constant ("k") lower than that of $SiO_2$, i.e., 3.9. Various types of low-k materials can have dielectric constants ranging for instance from about 3.5-3.9 (e.g., FSG), to less than about 3.2 (e.g., CDO, "Carbon Doped Oxide"), to as low as 2.0-2.2 (e.g., films with intentionally introduced porosity, such as porous MSQ) or even lower.

An etch stop film is used in various damascene processes to retard etching. Having an etch stop film that etches slower than the dielectric layer above or below defines a uniform depth for metal lines and sometimes allows simultaneous etching of trenches and vias. The etch stop film is usually deposited between two layers of dielectrics, although other configurations exist.

A good etch stop film would be highly selective, or be more resistant to etching, over the other films etched at the same time. Conversely, a thicker film of a less selective etch stop film would be needed to protect the dielectric layer because it would be etched faster than a highly selective film under the same conditions. A thinner etch stop film is desirable because a thicker etch stop film increases the overall k value, decreasing the RC benefits of using low-k dielectrics. Further, thinner films use less material and machine time, decreasing manufacturing costs.

A good etch stop film would also be hermetic to penetration by various compounds intentionally or unintentionally present during semiconductor manufacture, including for instance moisture and amines. Moisture is ubiquitous during semiconductor manufacture, but moisture penetration in a dielectric layer is undesirable. Penetration by moisture is one of the hardest things to prevent, since the water molecule diffuses rapidly through many dielectrics. Hermeticity is therefore often used as a measure of the moisture barrier capability of a deposited film and can be measured relatively. In general, moisture penetration in dielectric films causes an increase in dielectric constant that degrades device performance. It also causes reliability problems such as reduction in electromigration lifetime, enhanced stress migration and reduced Time Dependent Dielectric Breakdown (TDDB) for a number of reasons among which are poor adhesion, increased line-to-line leakage, metal oxidation and corrosion of the copper lines. In the case of a highly doped fluorosilicate glass (FSG), a commonly used dielectric, moisture cleaves the Si—F bond liberating mobile fluorine. The presence of mobile fluorine and hydrogen leads to the eventual formation of HF, which causes adhesion problems and subsequent blistering of the dielectric films. The moisture will also change the stress characteristics of the dielectric film, causing unwanted stress drift. Some etch-stop layers also serve as dielectric diffusion barrier layers that are deposited on the copper lines and are used to prevent interlayer copper diffusion. For this application, it is critical that the layer be hermetic for reliability.

A hard mask is used in a fashion similar to the etch stop film. A hardmask is typically used in dielectric etch when the material to be etched has a similar etch rate as the photoresist used to pattern the layer. In this case, a hard mask would be patterned with an etch chemistry that does not substantially etch the photoresist or underlying layer. The underlying layer can then be etched with a chemistry that does not etch the hardmask significantly. An example would be a nitride hardmask over an organic low k layer.

A hard mask can often be used as a CMP stopping layer as well. After removing excess metal from the top of the dielectrics it is sometimes desirable to have a film present that is not easily removed or damaged by CMP to for instance preserve softer low k layers underneath.

What is needed, therefore, is a method of making etch stop films and hard masks that have high selectivity and are more hermetic to improve device performance and reliability.

SUMMARY OF THE INVENTION

The present invention provides a method for the ultraviolet (UV) treatment of etch stop and hard mask films to increase etch selectivity and hermeticity by removing hydrogen, cross-linking the film, and increasing density. The UV exposure may be direct or through another dielectric layer and may be concurrent with thermal energy treatment (heating or annealing of the wafer). The method is particularly applicable in the context of damascene processing.

In particular embodiments, the invention relates to a method of forming a semiconductor device by depositing an etch stop film or a hard mask film on a substrate, exposing the top surface of the substrate to UV radiation to modify the etch properties of the etch stop film, and depositing a dielectric layer on the treated film. A first dielectric layer is usually, but may not be, deposited before the film. The UV radiation removes hydrogen, cross-links, and densifies the etch stop film.

In other embodiments, the film may be also treated with thermal energy in addition to UV radiation. The thermal treatment may occur before, during, or after the UV radiation treatment.

Some embodiments of the invention involve etch stop films or hard mask films that comprise one or more of SiNH, SiCH, SiCNH, SiCOH, SiOCH, SiBNH, SiBCH, SiBCNH, SiBCOH, SiONH, and SiONCH. The film may be deposited using a plasma enhanced chemical vapor deposition (PECVD) process. The film thickness is generally dependent on the thickness of the layer to be etched above it. This layer scales with the minimum dimension printed. Typically the thickness of the etch stop layer or hard mask is of the order of 10% of the overlying thickness. The film thickness may be 50-1200 angstroms, preferably between 75-300 angstroms.

The UV radiation may be applied directly to the film treated, or indirectly through a dielectric layer. In the case of direct treatment, the UV may have a power density of about 1 mW-20 W/cm$^2$, preferably 500 mW-5 W/cm$^2$, and a wavelength from about 125-500 nm. The exposure may be conducted at ambient temperature for <30 min, preferably <10 min. The exposure may also be conducted at elevated temperature (<450° C., preferably 300-450° C.) as part of the thermal treatment.

In the case of indirect treatment, the UV may have a power density of about 1 mW-20 W/cm² and a wavelength from about 125-500 nm. The exposure may be conducted at ambient temperature for about <30 min, preferably <10 min. The exposure may also be conducted at elevated temperature (<450° C., preferably 300-450° C.) as part of the thermal treatment for Back End of Line (BEOL) processing. For Front End of Line (FEOL) processing temperatures could be as high as 800° C.

These and other features and advantages of the present invention will be described in more detail below with reference to the associated drawings.

DETAILED DESCRIPTION

Embodiments of the present invention are described herein in the context of a UV treatment for etch stop or hard mask films in damascene processing. Those skilled in the art will realize that the following detailed description of the present invention is illustrative only and is not intended to be in any way limiting. Other embodiments of the present invention will readily suggest themselves to such skilled persons having the benefit of this disclosure. For example, although damascene processing is used in the discussion, the UV treatment of etch stop or hard mask films is effective in all applications where such films are used (e.g., aluminum interconnects).

Reference will be made in detail to implementations of the present invention as illustrated in the accompanying drawings. The same reference indicators will be used throughout the drawings and the following detailed description to refer to the same or like parts.

The term "semiconductor device" as used herein refers to any device formed on a semiconductor substrate or any device possessing a semiconductor material. In many cases, a semiconductor device participates in electronic logic or memory, or in energy conversion. The term "semiconductor device" subsumes partially fabricated devices (such as partially fabricated integrated circuits) as well as completed devices available for sale or installed in particular apparatus. In short, a semiconductor device may exist at any state of manufacture that employs a method of this invention or possesses a structure of this invention.

The present invention provides a method for the ultraviolet (UV) treatment of etch stop and hard mask film to modify their etch properties. UV radiation increases etch selectivity and hermeticity by removing hydrogen, cross-linking, and increasing density. The UV exposure may be direct or through another dielectric layer and may be concurrent with thermal energy treatment. The method is particularly applicable in the context of damascene processing.

In particular embodiments, the invention relates to a method of forming a semiconductor device by depositing an etch stop film or a hard mask film on a substrate, exposing the top surface of the substrate to UV radiation to remove hydrogen from the film, and depositing a dielectric layer on the film treated. A first dielectric layer may or may not be deposited before the film.

Figure 1:
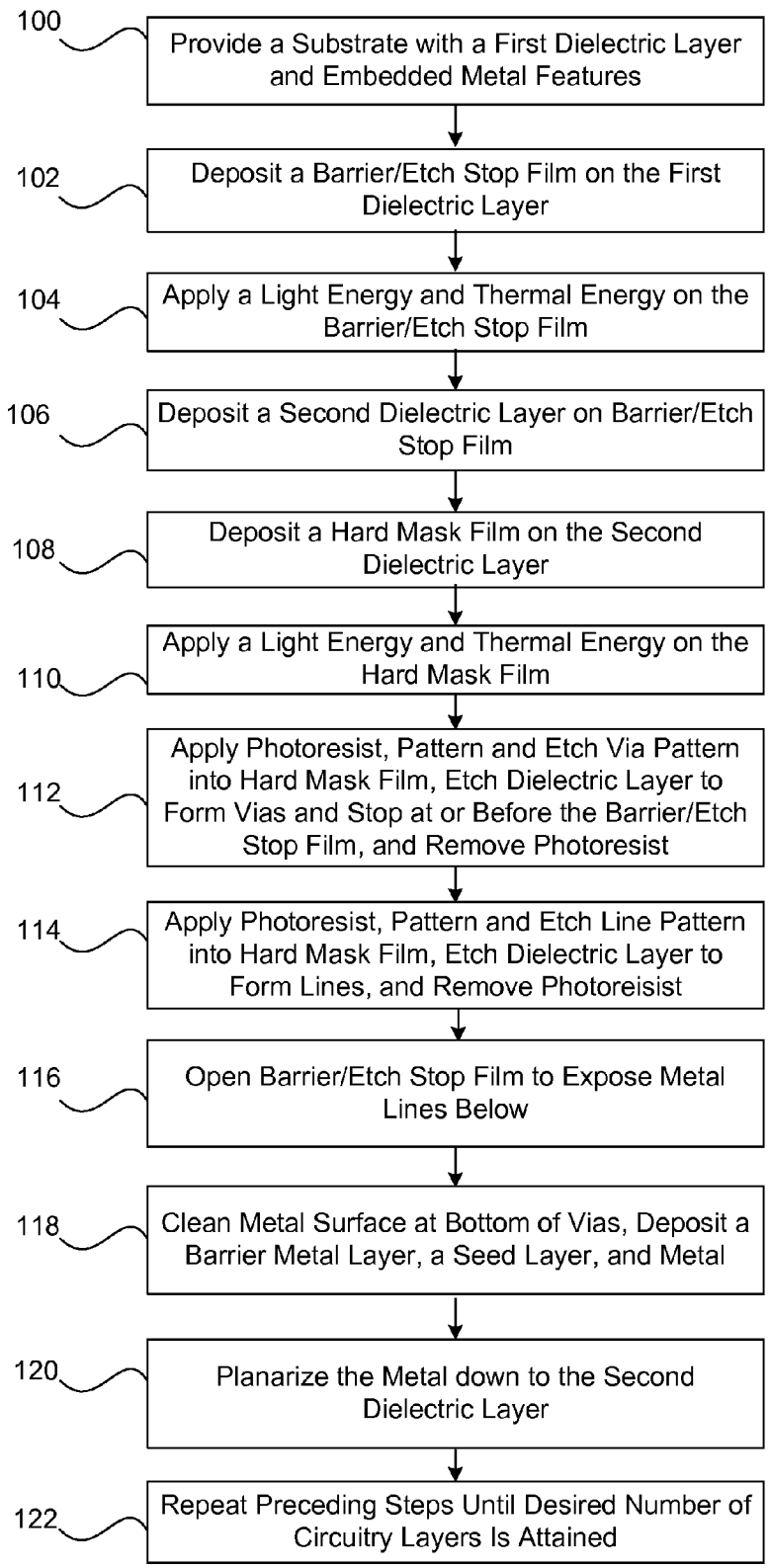
FIG. 1 is a process flow chart depicting a method in accordance with an embodiment of the invention.

FIG. 1 is a process flow chart depicting operations in a method in accordance with an embodiment of this invention. A generalized version of a dual damascene technique will be described below with reference to FIGS. 2A through 2D, which depict a partially formed semiconductor device during various stages of this process. However, the invention is not intended to be limited to the use of a dual damascene technique as the invention may be used with other techniques such as a single damascene processing or subtractive processing.

Referring to FIG. 1, a substrate containing a first dielectric layer and embedded metal lines is provided 100. An etch stop film is then deposited on the first dielectric layer 102. The etch stop film may be SiNH, SiCH, SiCNH, SiCOH, SiOCH, SiBNH, SiBCH, SiBCNH, SiBCOH, SiONH, SiONCH, or a combination of two or more of these. Some etch-stop layers also serve as dielectric diffusion barrier layers that are deposited on the copper lines and are used to prevent interlayer copper diffusion. The "Barrier/Etch Stop Film" in FIG. 1 refers to both etch stop films acting as barrier layer and other etch stop films acting as the etch selectivity layer. Following deposition, the etch stop film is treated with ultra-violet (UV) light energy and thermal energy 104. The thermal energy may be optionally applied by heating the substrate on a heater, by using radiation energy from the UV source, which often simultaneously emits infrared radiation, or by another heat source such as an infrared lamp.

The UV exposure may be conducted in vacuum. While the invention is not limited to this theory of operation, it is believed that the UV exposure drives the hydrogen from the film. Because hydrogen terminated silicon bonds (i.e. Si—H bonds) are related to open structures, density is related to the amount of hydrogen in the film. Driving the hydrogen from the film makes the silicon available for cross-linking with the carbon, nitrogen, oxygen, or boron in the film. The density of the film increases because the quantity of open structures decreases. Increasing the density of the film improves its selectivity and reduces the ability of water to move through the film, making it more hermetic. Thus, a thinner film may be used in lieu of the conventional thicker film.

The etch stop film may be exposed to a UV source that provides UV radiation throughout the film. While the invention is not limited to any particular theory of operation, it is believed that the UV radiation penetrates the entire film thickness, between 50 to 1200 angstroms, preferably between 75-300 angstroms, and provides uniform treatment throughout the film.

The UV exposure may also be conducted in a partial pressure of an inert gas (e.g., He, Ar, Ne, $N_2$, etc.) and/or a gas that participates in removal of hydrogen ($O_2$ for example) or in a reducing ambient ($H_2$, $NH_3$ forming gas and others).

The choices of UV wavelength(s), total exposure time and intensity, etc., depend on a number of factors, including the thickness of the film and the composition of the film. A typical UV exposure in accordance with this aspect of the invention has a power density of less than 5 W/cm², e.g., 1-3 W/cm² in either inert (e.g., He, Ar), reducing (for example forming gas, $NH_3$, or $H_2$), or oxidizing environments (e.g., in an anneal environment that comprises for instance one or more of oxygen, $H_2O$, ozone, peroxide or nitrous oxide).

The UV source can be a single wavelength excimer lamp or broad spectrum source with arc or microwave excitations. The wavelength can be from about 100 nm-800 nm, preferably from about 150-500 nm. The process pressure can range from about 1 mTorr to greater than 760 Torr (above one atmosphere), preferably from about 1 Torr to 200 Torr. The UV exposure can occur in the presence of He, Ar, $N_2$, $H_2$, $NH_3$, $N_2O$, $O_2$, or a mixture of them. The wafer temperature can be set at from about 25° C. to 450° C., preferably 300-450° C. for BEOL applications (after first metallization). For FEOL applications (before first metallization), the wafer temperature may be as high as 800° C.

The dose of UV exposure should be limited in order to prevent the etch stop film from excessive shrinking or straining. The dose is a function of dose time. UV curing may make the film more tensile (or less compressive) as hydrogen is evolved from the film. This can ultimately impact adhesion and quality of the film. Care must be taken not to over cure. Film properties before cure would likely determine the amount of curing that the film can tolerate without loss of adhesion or cracking. In general, the dose time should be for no more than 30 min and can result in a penetration of an etch stop film 50 angstroms to 1200 angstroms thick. A preferred dose time is less than 10 min.

The apparatus employed to implement the invention can have one or more UV sources. In some embodiments described herein, the apparatus will have a single UV source. Suitable apparatus are described in more detail below.

After the etch stop film is treated, a second layer of dielectric is deposited 106, followed by a hard mask film on top of the second dielectric layer 108. The hard mask film may be treated with light energy (e.g. UV radiation) and thermal energy (heat transfer) 110. The hard mask film may be SiNH, SiCH, SiCNH, SiOCH, SiCOH, SiBNH, SiBCH, SiBCOH, SiBCNH, SiONH, SiONCH, or a combination of two or more of these. The UV radiation treatment drives the hydrogen from the hard mask, causing it to cross-link and densify, thereby increasing its selectivity and hermeticity. As with the etch stop film treatment, optional thermal treatment may be applied. As discussed above, hard mask films are typically used in dielectric etch when the material to be etched has a similar etch rate as the photoresist used to pattern the layer. Hard masks and etch stop films may be the same materials and therefore behave similarly under UV and thermal cure.

In this case, a hard mask would be patterned with an etch chemistry that does not substantially etch the photoresist or underlying layer, limiting the pattern to the hard mask. Patterns of conductive features are formed in the dielectric film, generally by first patterning and etching the via pattern in the hard mask, then etching the dielectric layer down to the etch stop 112 (or barrier/etch stop). The etching generally stops at or before the etch stop film above the metal. The conductive features are typically vias. In one example, they are the interconnects of a metallization layer that is formed from copper. The etching may also remove the photoresist used to pattern the hard mask.

In another step, the line patterns are etched in the hard mask by applying a photoresist and patterning and etching the hard mask 114. Then the dielectric layer is etched to form lines (trenches) to be filled with a metal 114. During this etching step, the photoresist used to pattern the hard mask may be removed. Optionally, the photoresist may be removed in a separate step.

After the lines are created, the etch stop film is opened through the first dielectric layer to expose metal lines below, forming vias 116. The vias may then be filled at 118 by first cleaning the metal surface, depositing a barrier metal layer, a metal seed layer, and the metal. The metal may be copper. Because copper diffuses readily into surrounding dielectric material, a barrier metal layer, such as TaN is usually deposited first to prevent such diffusion. If copper is used, a copper seed layer is deposited, to promote film growth during electrochemical plating process. If another metal is used, a seed layer may not be necessary.

The excess material may be removed by a planarization process to form an exposed pattern of conductive features in the second dielectric layer 120. As discussed above, one widely-used planarization process is chemical mechanical polishing (CMP).

Finally, this entire process may be repeated 122 to attain the desired levels of metal features in the device. It should be noted that the foregoing description is just an example of one dual damascene process with which the present invention may be implemented. A via-first dual damascene process has been described, where the top layer is patterned and etched twice, once for the vias and once for the trenches. In other embodiments, a trench first process, in which the etching of the line trenches precedes etching of the vias, may be used. These various damascene processing techniques, and other variations thereon, are well known in the art and represent alternative implementation contexts for embodiments of the present invention. The invention is also applicable in single damascene processing, more conventional metal deposition and etch, and essentially any semiconductor processing context where etch stop and hard mask films are used.

In other embodiments, the UV radiation treatment of the etch stop and the hard mask films may occur after a subsequent dielectric deposition. It is believed that UV radiation penetrates deeply into dielectric layers such as $SiO_2$, SiOC, SiOF, $SiO_2$:P, and $SiO_2$:B. Therefore, UV radiation may be applied to a subsequent layer to treat the underlying etch stop or hard mask film.

Figure 2A:
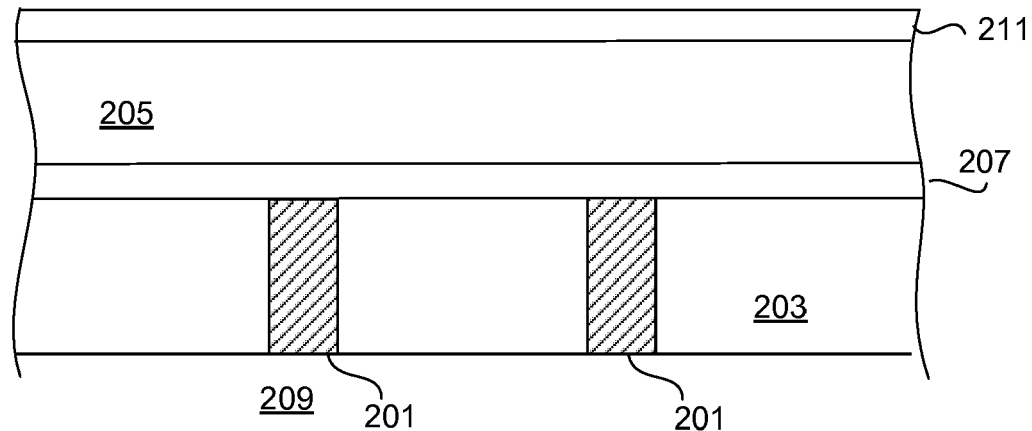
FIGS. 2A-2D are cross sectional diagrams illustrating the formation of a semiconductor device by a dual damascene process in accordance with an embodiment of the invention.

Referring now to FIGS. 2A-2D, a typical dual damascene process incorporating the etch stop and hard mask film treatment processes of the present invention is illustrated. In FIG. 2A, a first a layer of a dielectric 203 and an etch stop film 207 is shown on substrate 209. The first dielectric layer 203 may contain embedded metal lines 201. The etch stop film may be treated with UV and thermal energy. Then second dielectric layer 205 is deposited on the treated etch stop layer. UV treatment of the etch stop film may occur after the etch stop film 207 is deposited or, less commonly, after the second dielectric film 205 is deposited. In some embodiments, an additional etch stop layer may be embedded in the second dielectric film 205 to form the line. This additional etch stop layer is not required.

A hard mask film 211 is deposited on top of the second dielectric layer 205. The hard mask film 211 may be treated with UV radiation to cross-link the film and increase density and hermeticity.

A photoresist is applied to the hard mask 211 and a via pattern exposed. The via pattern is etched into the hard mask 211 and down into the dielectric 205, stopping at or before the etch stop layer 207. The etching of hard mask and the dielectric may occur in the same operation or different operations.

Figure 2B:
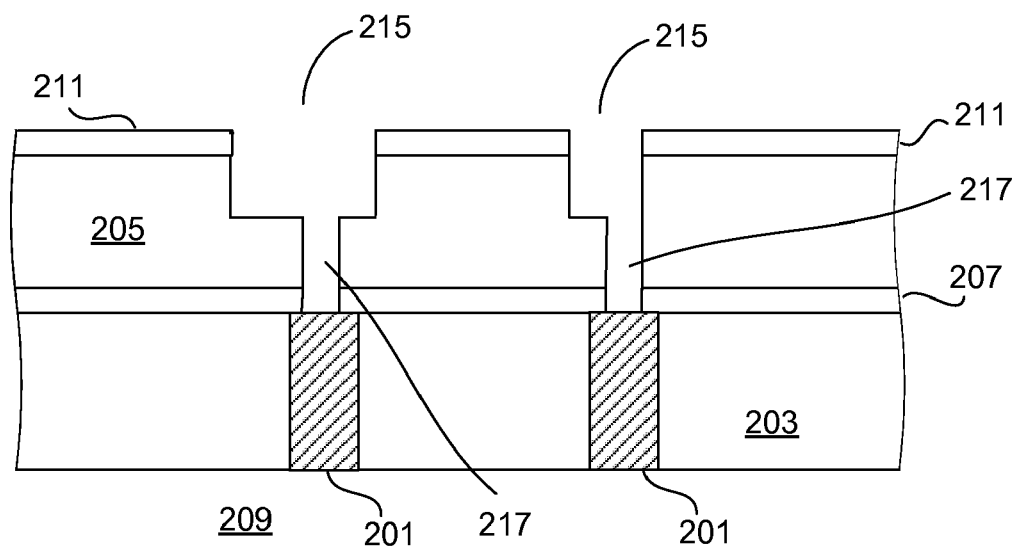

The hard mask 211 is then patterned again and etched, but this time with a line pattern, shown as 215 in FIG. 2B. In some embodiments, the line pattern etch stops at an embedded etch stop layer. In other embodiments, the line pattern may be etched uniformly to the same thickness across the wafer without an embedded etch stop layer by controlling the process parameters.

Then the etch stop film 207 is opened to expose the embedded metal 201. FIG. 2B shows the results of etched features where the via patterns are shown as 217 and the line patterns are shown as 215.

Thereafter a thin layer of conductive barrier layer material 219 is formed on the exposed surfaces (including sidewalls) of layers 207 and 205. Conductive barrier layer material 219 may be consist of, for example, a tantalum nitride/tantalum bilayer. A CVD, PVD or ALD operation is typically employed to deposit conductive barrier layer material 219.

Figure 2C:
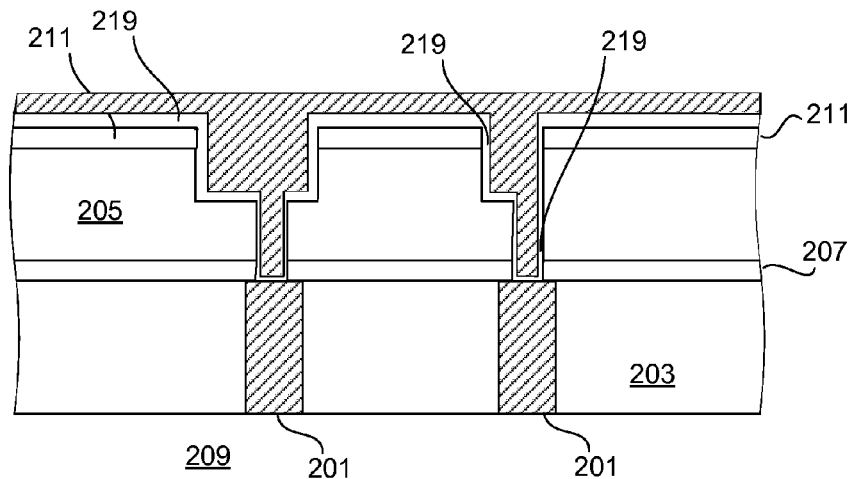
Figure 2D:
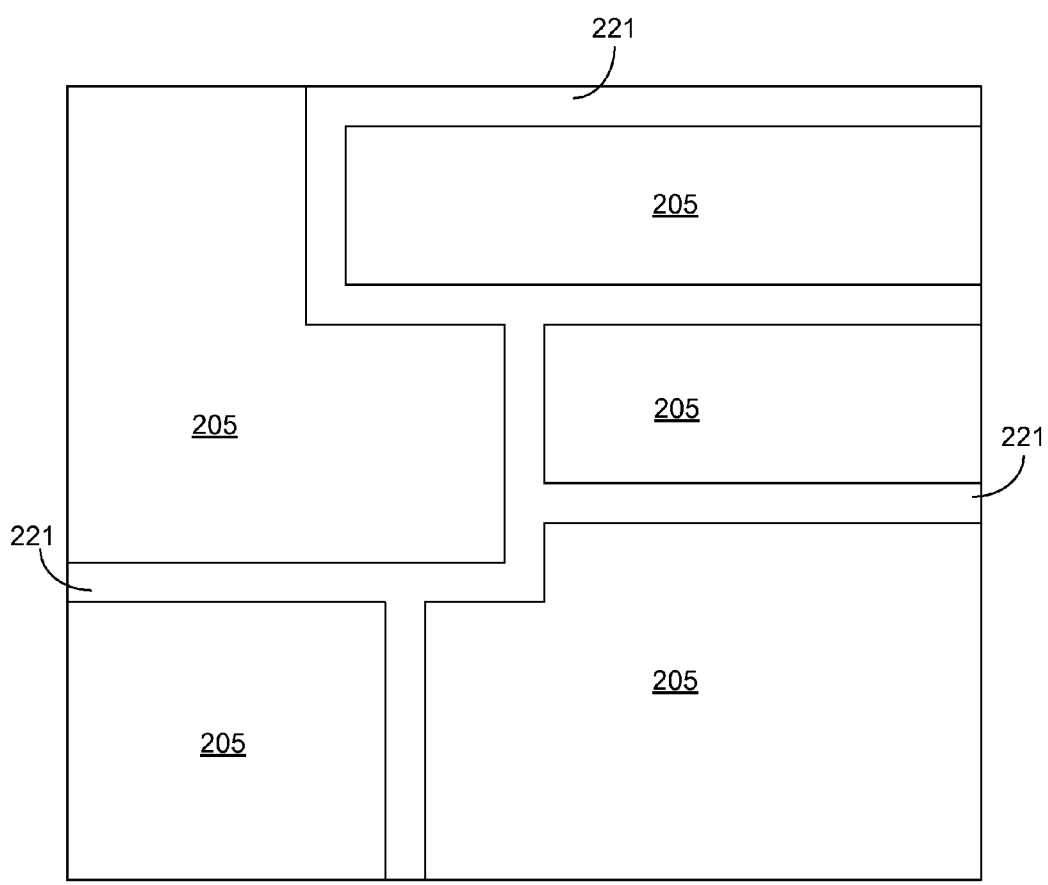

After the barrier layer is deposited, a conductive metal (typically copper) is deposited in the via holes and line paths 217 and 215. Conventionally this deposition is performed in two steps: an initial deposition of a conductive seed layer followed by bulk deposition of copper by electroplating. The seed layer may be deposited by physical vapor deposition, chemical vapor deposition, atomic layer deposition, electroless plating, etc. Note that the bulk deposition of copper not only fills line paths 215 and via holes 217 but, to ensure complete filling, also covers all the exposed regions on top of the barrier film 219. FIG. 2C shows the result of the copper filling 221.

Thus, it becomes necessary to planarize the structure and remove the excess copper from the device. Planarization removes material down to the level of the top of dielectric film 205, often removing part of this dielectric layer to optimize planarity. This results in an exposed pattern of conductive lines 221 in dielectric layer 205 and vias in dielectric layer 203. Planarization may be accomplished by various techniques. Typically, the process involves some amount of CMP. It may also involve a combination of electropolishing, to remove most of the excess bulk copper, followed by CMP to remove the remaining copper and conductive barrier down to the level of the dielectric film 205 or slightly beyond.

FIG. 4C shows a top view of the metallization layer after the planarization process. The metal lines 221 are exposed as well as the dielectric film 205.

Apparatus

The present invention can be implemented in many different types of apparatus. In preferred embodiments, the apparatus will include one or more chambers (sometimes referred to as process vessels) that house one or more wafers and are suitable for wafer processing. At least one chamber will include a UV source. A single chamber may be employed for all operations of the invention or separate chambers may be used. Each chamber may house one or more wafers (substrates) for processing. The one or more chambers maintain the wafer in a defined position or positions (with or without motion within that position, e.g., rotation, vibration, or other agitation) during procedures of the invention. For certain operations in which the wafer temperature is to be controlled, the apparatus may include a heating or cooling platen.

Figure 3:
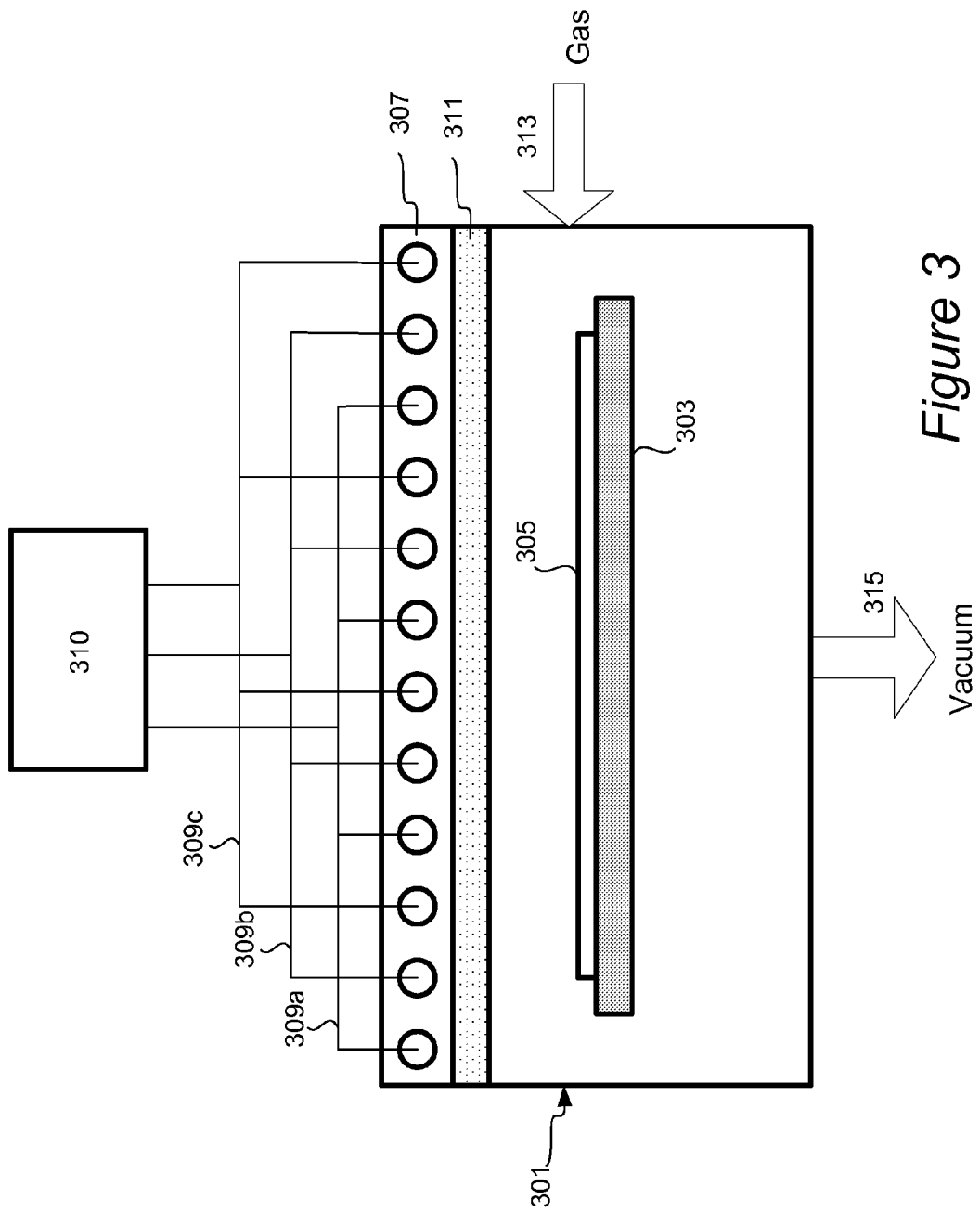
FIG. 3 is a schematic diagram of an example chamber suitable for implementing the present invention.

FIG. 3 is a schematic diagram of an example chamber 301 in accordance with the invention. Chamber 301 is capable of holding a vacuum and/or containing gases at pressures above atmospheric pressure. For simplicity, only one chamber 301 is shown. It is noted that in preferred embodiments, chamber 301 is one chamber in a multi-chambered apparatus (entire apparatus not shown) or one station in a multi-station chamber, although chamber/station 301 could alternatively be part of a stand-alone single chambered apparatus. Suitable multi-chambered apparatus, for example, include the modified Novellus Sequel system. A suitable multi-station chamber may be a Novellus Sola system.

A substrate holder 303 secures a wafer 305 in a position such that light from a UV light source-array 307 can irradiate wafer 305. Temperature of the substrate can be controlled by a temperature control mechanism embedded in the substrate support such as a heater, a cooler, or both. The amount of heat transfer from the substrate support to the substrate may be modulated by controlling the substrate support temperature setpoint, the gap between the substrate support and the substrate, as well as the pressure of the gas in the chamber, which defines the rate of heat transfer. The heat source may also be infrared light emitted from the UV radiation lamps.

Chamber 301 is configured with a gas inlet 315, which is connected to a gas source, and with a vacuum outlet 313, which is connected to a vacuum source. The amount of gas introduced into the chamber 301 can be controlled by valves and mass flow controller and pressure can be measured by pressure gauge (not shown).

In this example, the UV light source array 307 is mounted outside the chamber 301. In alternate embodiments, the UV light source array may be housed inside the chamber 301. UV light source array 307 includes an array of individual UV sources such as mercury vapor or xenon lamps. Note that the invention is not limited to mercury vapor or xenon lamps as UV light sources and other suitable light sources include deuterium lamps or lasers (e.g., excimer lasers and tunable variations of various lasers). Various optical elements, such as reflectors, may be required to direct the UV light toward portions of the substrate. Methods for directing the light at different portions of the substrate at different times may be required as well. A scanning mechanism may be used for this purpose. A window 311 made of quartz, $CaF_2$, sapphire or other suitable material is positioned between UV light source array 307 and wafer 305 to provide vacuum isolation. Filters can also be used to remove unwanted spectral components from particular sources to "tune" the sources.

The UV light source array 307 may be comprised of one or more types of UV sources, for example an array of three types of UV sources, each type providing UV radiation with a different wavelength distribution. The UV sources are electrically connected to each other (309a, 309b and 309c) and controlled by control system 310, which controls when each of the various UV sources is illuminated. Control system 310 is typically, but not limited to, a computer processing system such as a PC or workstation. Of course, any number and types of individual light sources in any suitable configuration can be used.

Note that the light source array and control configuration of FIG. 3 is only an example of a suitable configuration. In general, it is preferable that the lamps are arranged to provide uniform UV radiation to the wafer. For example, other suitable lamp arrangements can include circular lamps concentrically arranged or lamps of smaller length arranged at 90 degree and 180 degree angles with respect to each other may be used. The light source(s) can be fixed or movable so as to provide light in appropriate locations on the wafer. Alternatively, an optical system, including for example a series of movable lenses, filters, and/or mirrors, can be controlled to direct light from different sources to the substrate at different times. In order to achieve uniform UV dose across the wafer, the wafer can be moved, scanned, or rotated during irradiation.

The UV light intensity can be directly controlled by the type of light source and by the power applied to the light source or array of light sources. Factors influencing the intensity of applied power include, for example, the number of light sources (e.g., in an array of light sources) and the light source types (e.g., lamp type or laser type). Other methods of controlling the UV light intensity on the wafer sample include using filters that can block portions of light from reaching the wafer sample. As with the direction of light, the intensity of light at the wafer can be modulated using various optical components such as mirrors, lenses, diffusers and filters. The spectral distribution of individual sources can be controlled by the choice of sources (e.g., mercury vapor lamp vs. xenon lamp vs. deuterium lamp vs. excimer laser, etc.) as well as the use of filters that tailor the spectral distribution. In addition, the spectral distributions of some lamps can be tuned by doping the gas mixture in the lamp with particular dopants such as iron, gallium, etc.

It should be understood that the apparatus depicted in FIG. 3 is only an example of a suitable apparatus and other designs for other methods involved in previous and/or subsequent processes may be used. Other examples of apparatus suitable for implementing the present invention are described in commonly assigned co-pending application Ser. Nos. 11/115,576 filed Apr. 26, 2005, 10/800,377 filed Mar. 11, 2004 and 10/972,084 filed Oct. 22, 2004, incorporated by reference herein.

While the invention has been described primarily in the context of damascene processing, it may also be applicable in other semiconductor processing contexts. Examples include, but are not limited to, aluminum interconnects and tungsten/aluminum interconnects, Damascene gate or replacement gates and the fabrication of FinFETs.

Although the foregoing invention has been described in some detail for purposes of clarity of understanding, it will be apparent that certain changes and modifications may be practiced within the scope of the appended claims. It should be noted that there are many alternative ways of implementing both the process and compositions of the present invention. Accordingly, the present embodiments are to be considered as illustrative and not restrictive, and the invention is not to be limited to the details given herein.

What is claimed is:

1. A method of forming a semiconductor device, comprising:
    depositing an etch stop film on a top surface of a substrate;
    exposing the top surface of the substrate to ultra-violet (UV) radiation such that the etch properties of the etch stop film are modified; and,
    depositing a dielectric layer on the etch stop film, wherein the UV exposure occurs after the dielectric film is deposited on the etch stop film such that the UV radiation is applied to modify the etch stop film indirectly through the dielectric layer and wherein UV radiation is effective to remove Si—H bonds within the etch stop film.

2. The method of claim 1, further comprising treating the substrate with thermal energy.

3. The method of claim 2, wherein the thermal energy treatment maintains the substrate temperature at 100° C. to 800° C.

4. The method of claim 2, wherein the thermal energy treatment maintains the substrate temperature at 300° C. to 400° C.

5. The method of claim 2, wherein the thermal energy is applied using a heater embedded in a substrate support and/or radiant source.

6. The method of claim 1, wherein the UV exposure removes hydrogen from the etch stop film.

7. The method of claim 1, wherein the UV radiation has a power density of about 1 mW-20 W/cm$^2$ and a wavelength from about 150-400 nm, and the exposure is conducted at ambient temperature for less than 20 minutes.

8. The method of claim 1, wherein the etch stop film is deposited using a PECVD process and its thickness is 50-500 angstroms.

9. The method of claim 1, wherein the etch stop film comprises one or more of SiNH, SiCH, SiCNH, SiOCH, SiCOH, SiBNH, SiBCH, SiBCOH, SiBCNH, SiONH and SiONCH.

10. The method of claim 1 further comprising depositing a hard mask film on the dielectric layer and exposing the top surface of the substrate to UV radiation such that the etch properties of the hard mask film are modified.

11. A method of forming a semiconductor device, comprising:
    depositing a first dielectric layer on a top surface of a substrate;
    depositing a hard mask film on the first dielectric layer;
    depositing a second dielectric layer on the hard mask; and
    exposing the top surface of the substrate to ultra-violet (UV) radiation such that the etch properties of the hard mask film are modified, wherein the UV exposure occurs after the second dielectric film is deposited on the hard mask film such that the UV radiation is applied to modify the hard mask film indirectly through the second dielectric layer and wherein the UV radiation is effective to remove Si—H bonds within the film.

12. The method of claim 11, further comprising treating the substrate with thermal energy.

13. The method of claim 12, wherein the UV exposing is performed after the thermal treating.

14. The method of claim 11, wherein the UV radiation has a power density of about 1 mW-20 W/cm$^2$ and a wavelength from about 150-400 nm, and the exposure is conducted at ambient temperature for less than 20 minutes.

15. The method of claim 11, wherein the hard mask film is deposited using a PECVD process and its thickness is 50-500 angstroms.

16. The method of claim 11, wherein the thermal energy treatment maintains the substrate temperature at about 100° C. to 800° C.

17. The method of claim 11, wherein the thermal energy treatment maintains the substrate temperature at about 300° C. to 400° C.

18. The method of claim 11, wherein the thermal energy is applied using a heater embedded in a substrate support and/or by a radiant source.

19. The method of claim 11, wherein the UV exposure removes hydrogen from the hard mask film.

20. The method of claim 11, wherein the hard mask film comprises one or more of SiNH, SiCH, SiCNH, SiOCH, SiCOH, SiBNH, SiBCH, SiBCOH, SiBCNH, SiONH, and SiONCH.

* * * * *